(12) United States Patent
Kuroda et al.

(10) Patent No.: US 8,629,002 B2
(45) Date of Patent: *Jan. 14, 2014

(54) MANUFACTURING METHOD OF SEMICONDUCTOR DEVICE

(71) Applicant: Renesas Electric Corporation, Kawasaki (JP)

(72) Inventors: Soshi Kuroda, Kanagawa (JP); Masatoshi Yasunaga, Kanagawa (JP); Hironori Matsushima, Kanagawa (JP); Kenya Hironaga, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/662,204

(22) Filed: Oct. 26, 2012

(65) Prior Publication Data

US 2013/0065364 A1 Mar. 14, 2013

Related U.S. Application Data

(63) Continuation of application No. 13/023,976, filed on Feb. 9, 2011, now Pat. No. 8,334,172.

(30) Foreign Application Priority Data

Feb. 9, 2010 (JP) ................................ 2010-030336

(51) Int. Cl.
*H01L 21/56* (2006.01)
*H01L 21/58* (2006.01)
*H01L 21/60* (2006.01)

(52) U.S. Cl.
USPC ............. 438/118; 257/E21.502; 257/E21.506

(58) Field of Classification Search
None
See application file for complete search history.

(56) References Cited

U.S. PATENT DOCUMENTS 8,334,172 B2 * 12/2012 Kuroda et al. ................ 438/113
2010/0330504 A1 12/2010 Irisawa et al.

FOREIGN PATENT DOCUMENTS

| JP | 10-041337 A | 2/1998 |
| JP | 2002-217519 A | 8/2002 |
| JP | 2007-19275 A | 1/2007 |

OTHER PUBLICATIONS

Japanese Office Action, with English translation, issued in Application No. 2010-030336 dated Aug. 27, 2013.

* cited by examiner

*Primary Examiner* — Seavosh Nikmanesh
(74) *Attorney, Agent, or Firm* — McDermott Will & Emery LLP (57) ABSTRACT

To provide a technology capable of preventing the deterioration of the reliability of semiconductor devices caused by the gasification of a part of components of the material constituting a wiring substrate.

A wiring layer constituting a circuit pattern is formed over each of the front and rear surfaces of a glass epoxy substrate, and after the formation of a solder resist covering the wiring layer while exposing a part of the wiring layer and prior to a heat treatment (first heat treatment) at 100° C. to 150° C. for dehumidification, a heat treatment (second heat treatment) at 160° C. to 230° C. for gasifying and discharging an organic solvent contained in the material constituting a wiring substrate is performed for the wiring substrate.

5 Claims, 10 Drawing Sheets

MANUFACTURING METHOD OF SEMICONDUCTOR DEVICE

RELATED APPLICATIONS

This application is the Continuation of U.S. application Ser. No. 13/023,976, filed on Feb. 9, 2011, which in turn claims the benefit of Japanese Application No. 2010-030336, filed on Feb. 15, 2010, the disclosures of which Applications are incorporated by reference in its entirety.

CROSS-REFERENCE TO RELATED APPLICATION

The disclosure of Japanese Patent Application No. 2010-30336 filed on Feb. 15, 2010 including the specification, drawings and abstract is incorporated herein by reference in its entirety.

BACKGROUND OF THE INVENTION

The present invention relates to a manufacturing technology of a semiconductor device, in particular, to a technology useful when applied to a manufacturing method of a semiconductor device having a process of mounting a semiconductor chip over the surface of a wiring substrate.

For example, Japanese Patent Laid-Open No. 1998-41337 (Patent Document 1) discloses a manufacturing method of a mounting substrate, in which a glass epoxy substrate is previously subjected to burn-in in a high-temperature dry atmosphere, coated with a moisture-resistant resin material, and, after that, the moisture-resistant resin material is also coated over the cut surface and hole wall of the glass epoxy resin. In the burn-in, for example, the glass epoxy substrate is left in a dry nitrogen atmosphere at 180° C. for one hour to remove moisture existing inside the glass epoxy substrate.

SUMMARY OF THE INVENTION

In BGA (Ball Grid Array) or LGA (Land Grid Array), there occurs such a problem as quality deterioration or productivity lowering caused by gasification of a part of components of materials constituting the wiring substrate in the manufacturing process.

As the phenomenon of the quality deterioration, for example, there can be mentioned three phenomena described below. (1) When a die bond film is stuck to the surface of the wiring substrate, gas generated from the wiring substrate is incorporated and left as a gas bubble inside the die bond film. Subsequently, moisture accumulates in the gas bubble, and, for example, when the semiconductor device is mounted over the mounting substrate by using solder, heat of about 260° is applied to the die bond film to induce phreatic eruption. (2) When gas generated from the wiring substrate contaminates the surface of the semiconductor chip, in a wire bonding process, the bonding wire is not coupled to an electrode pad arranged over the surface of the semiconductor chip but peels off. (3) The contamination of the surface of the semiconductor chip by gas generated from the wiring substrate lowers the adhesion properties to the semiconductor chip and a resin sealing body that seals the semiconductor chip, in a molding process.

As the productivity lowering, for example, there are mentioned the contamination of a die bonding apparatus or a wire bonding apparatus to thereby increase the cleaning frequency of these apparatuses.

The contaminant can be removed, relative to the phenomenon (2) mentioned as the quality deterioration phenomenon, by applying a plasma cleaning process prior to the wire bonding process, and, relative to the phenomenon (3) mentioned as the quality deterioration phenomenon, by applying a plasma cleaning process prior to the molding process. However, there occurs necessity to apply two plasma cleaning processes, which leads to the productivity lowering of the semiconductor device.

The present invention has been made in view of the above circumstances and provides a technology that can prevent the deterioration of the reliability of semiconductor devices caused by the gasification of a part of components of the material constituting the wiring substrate.

The other purposes and the new features of the present invention will become clear from the description of the present specification and the accompanying drawings.

The following explains briefly an embodiment of a typical invention among inventions disclosed in the present application.

The embodiment is a manufacturing method of a semiconductor device including the steps of preparing a wiring substrate having a glass epoxy substrate, a wiring layer that is formed over each of the front and rear surfaces of the glass epoxy substrate and that constitutes a circuit pattern, and a solder resist covering the wiring layer while exposing a part of the wiring layer, sticking a semiconductor chip to the upper surface side of the wiring substrate via an adhesion layer in a film shape, connecting electrically an electrode pad arranged over the surface of the semiconductor chip with a bonding lead that contains a part of a wiring layer and is exposed from an opening formed in the solder resist by an electroconductive member, and forming a resin sealing body for sealing the semiconductor chip, the electroconductive member and the adhesive layer in a film shape, wherein the prepared wiring substrate is subjected to a heat treatment at 160° C. to 230° C. for gasifying and discharging an organic solvent contained in the material constituting the wiring substrate after the formation of the solder resist and before a heat treatment at 100° C. to 150° C. for dehumidification.

The following explains briefly the effect acquired by one embodiment of the typical invention among the inventions disclosed in the present application.

The deterioration of the reliability of semiconductor devices caused by the gasification of a part of components of the material constituting the wiring substrate can be prevented.

DETAILED DESCRIPTION OF PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to members having the same function, as a principle, and the repeated explanation thereof is omitted. Hereinafter, the embodiment of the invention will be explained in detail on the basis of the drawings.

Figure 1:
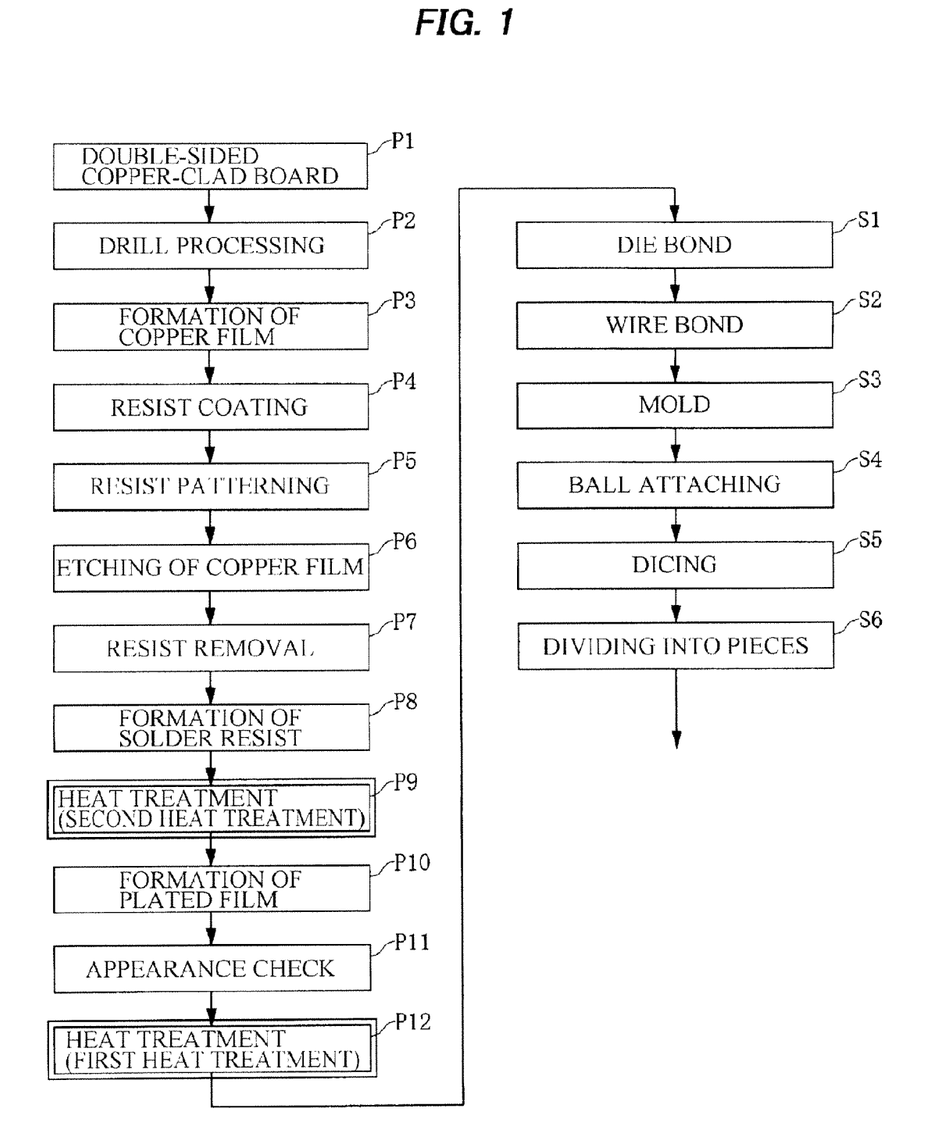
FIG. 1 is a process chart for explaining the manufacturing method of a semiconductor device according to one embodiment of the present invention.
Figure 18:
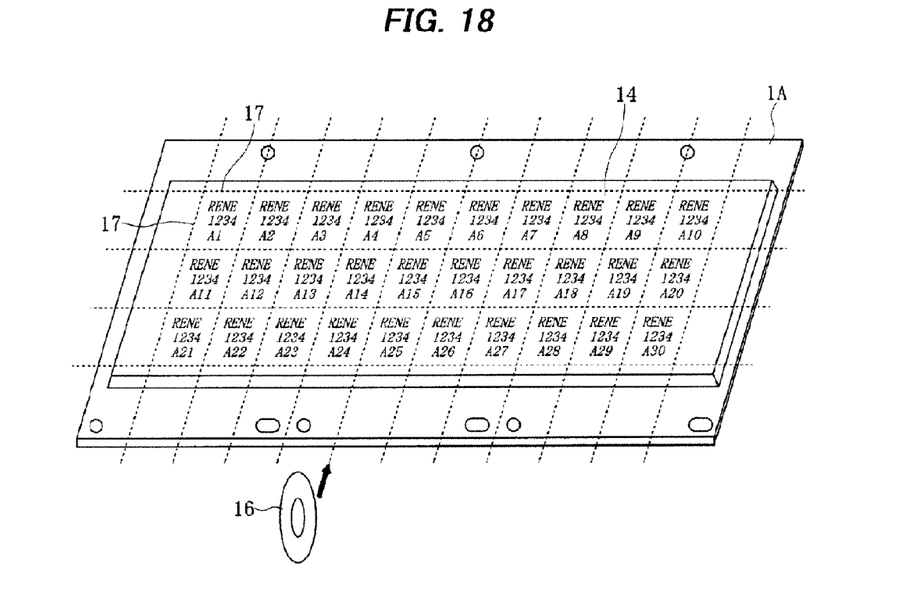
FIG. 18 is a principal part perspective view of the semiconductor device in the manufacturing process of the semiconductor device following FIG. 17.
Figure 19:
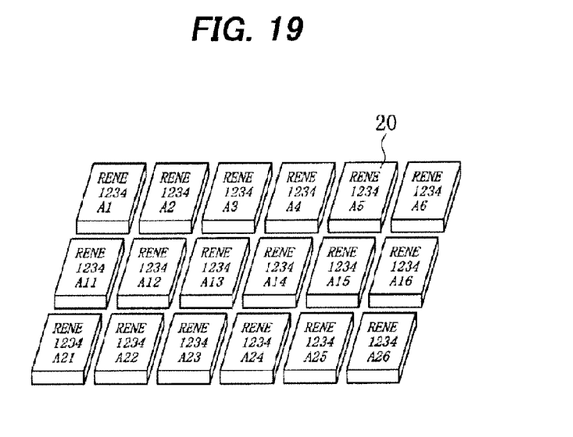
FIG. 19 is a principal part perspective view of the semiconductor device in the manufacturing process of the semiconductor device following FIG. 18.

The manufacturing method of a semiconductor device according to the embodiment will be explained in order of processes by using FIGS. 1 to 19. FIG. 1 is a process chart explaining the manufacturing method of a semiconductor device according to the embodiment, FIGS. 2 to 17 are principle part cross-sectional views of the semiconductor device explaining the manufacturing method of a semiconductor device according to the embodiment, and FIGS. 18 and 19 are principal part perspective views of the semiconductor device explaining the manufacturing method of a semiconductor device according to the embodiment.

The manufacturing process of the wiring substrate will be explained using FIGS. 2 to 12.

Figure 2:
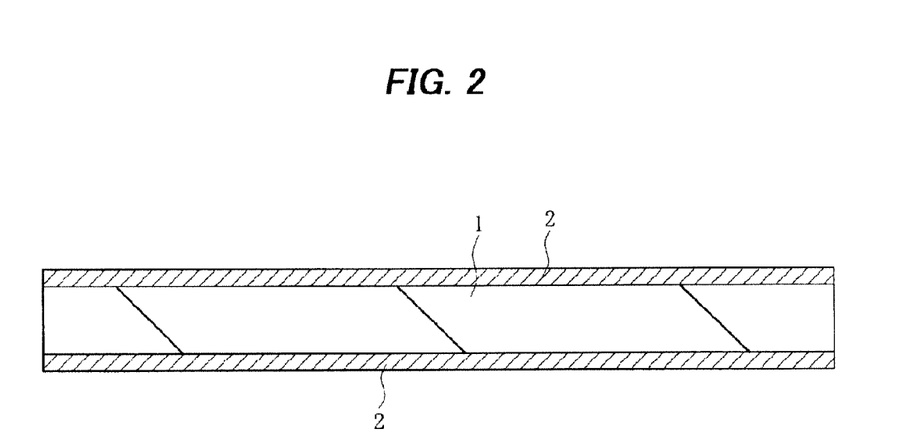
FIG. 2 is a principle part cross-sectional view of the semiconductor device for explaining the manufacturing method of a semiconductor device according to one embodiment of the invention.

First, as shown in FIG. 2, a glass epoxy substrate (base material) 1 is prepared. The glass epoxy substrate 1 is an insulator formed by weaving thin glass fibers into a cloth shape, and stacking up the cloths in certain number of layers by using epoxy resin containing an organic solvent to be formed into a plate shape. Subsequently, to each of the front and rear surfaces of the glass epoxy substrate 1, a copper foil 2 is pressure-bonded (process P1 in FIG. 1). The copper foil 2 has a thickness of, for example, about 12 μm.

Figure 3:
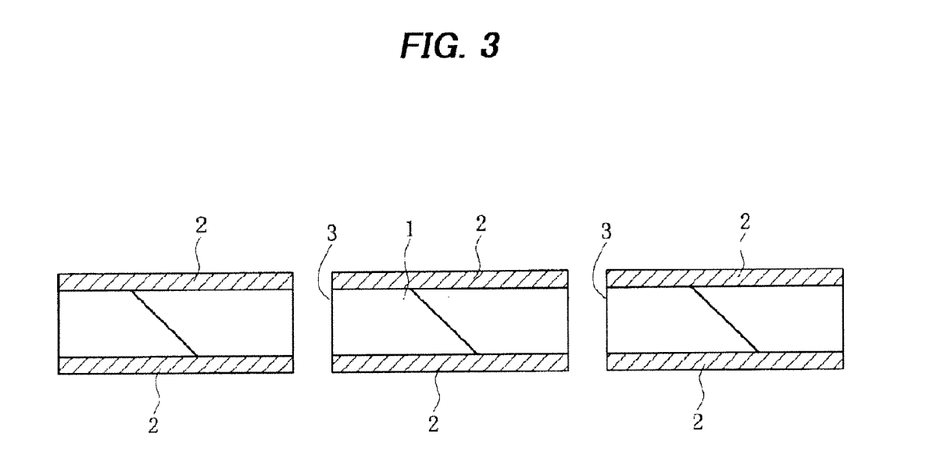
FIG. 3 is a principle part cross-sectional view of the semiconductor device in the manufacturing process of the semiconductor device following FIG. 2.

Next, as shown in FIG. 3, plural through-holes (via) 3 passing through from the front surface to the rear surface of the glass epoxy substrate 1 are formed by, for example, a drill processing (process P2 in FIG. 1).

Figure 4:
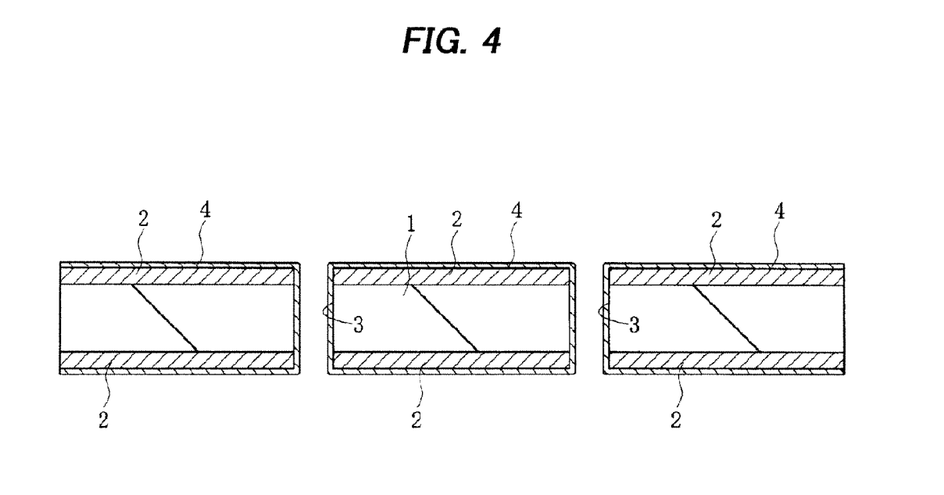
FIG. 4 is a principle part cross-sectional view of the semiconductor device in the manufacturing process of the semiconductor device following FIG. 3.
Figure 5:
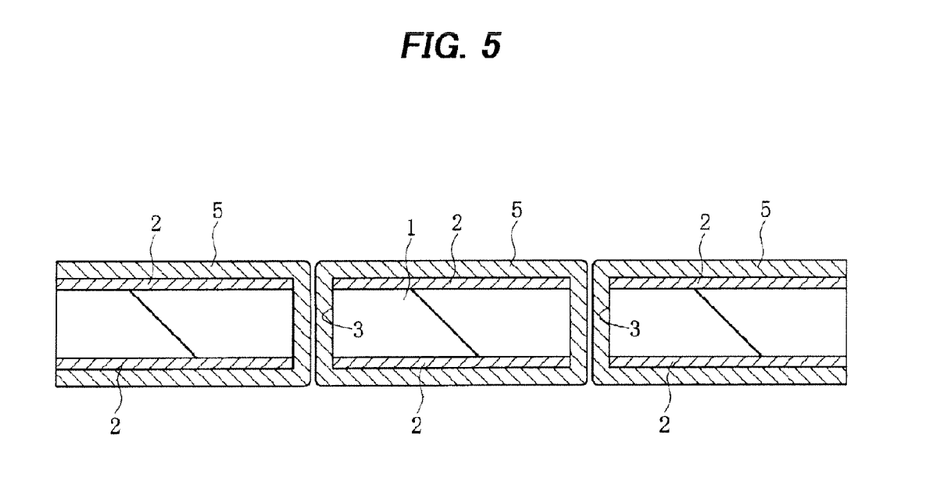
FIG. 5 is a principle part cross-sectional view of the semiconductor device in the manufacturing process of the semiconductor device following FIG. 4.

Next, as shown in FIG. 4, a seed layer 4 of copper is formed over each of copper foils 2 formed over the front and rear surfaces of the glass epoxy substrate 1, and the inner wall of through-hole 3. Subsequently, as shown in FIG. 5, a copper film 5 is formed over the copper foils 2 formed over each of the front and rear surfaces of the glass epoxy substrate 1, and the inner wall of the through-hole 3 by an electrolytic plating method (process P3 in FIG. 1). The copper film 5 has a thickness of, for example, about 5 to 20 μm.

Figure 6:
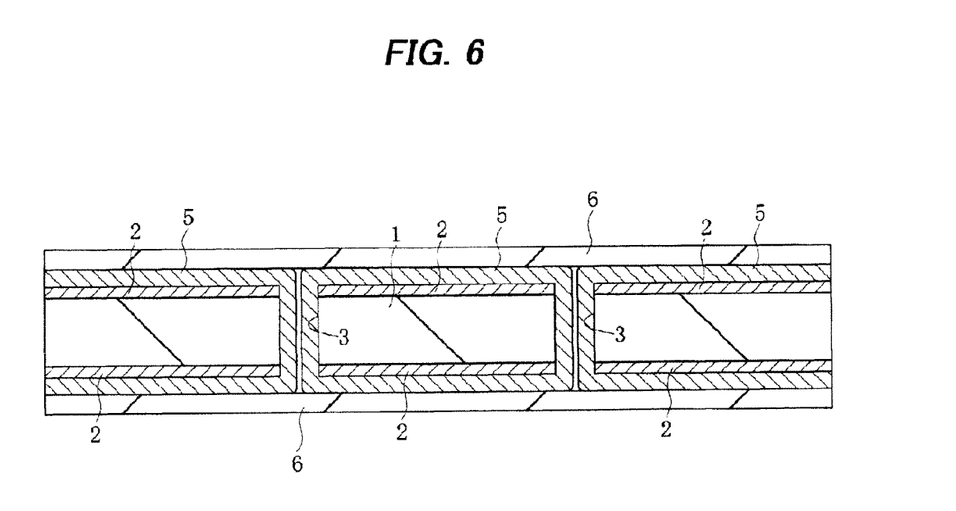
FIG. 6 is a principle part cross-sectional view of the semiconductor device in the manufacturing process of the semiconductor device following FIG. 5.
Figure 7:
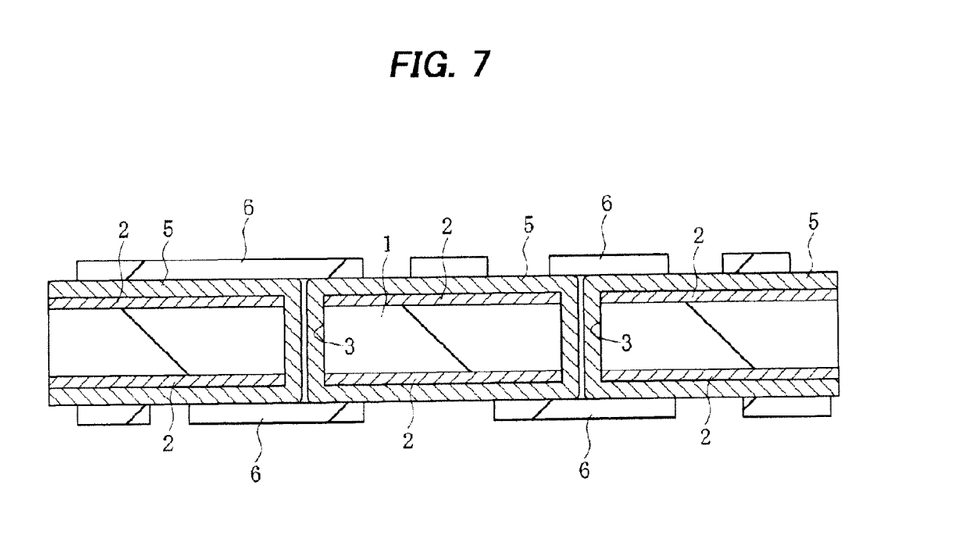
FIG. 7 is a principle part cross-sectional view of the semiconductor device in the manufacturing process of the semiconductor device following FIG. 6.
Figure 8:
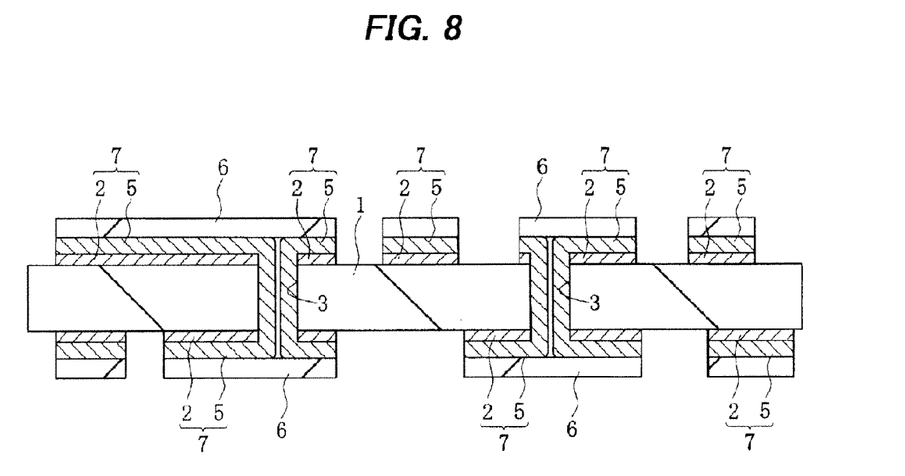
FIG. 8 is a principle part cross-sectional view of the semiconductor device in the manufacturing process of the semiconductor device following FIG. 7.
Figure 9:
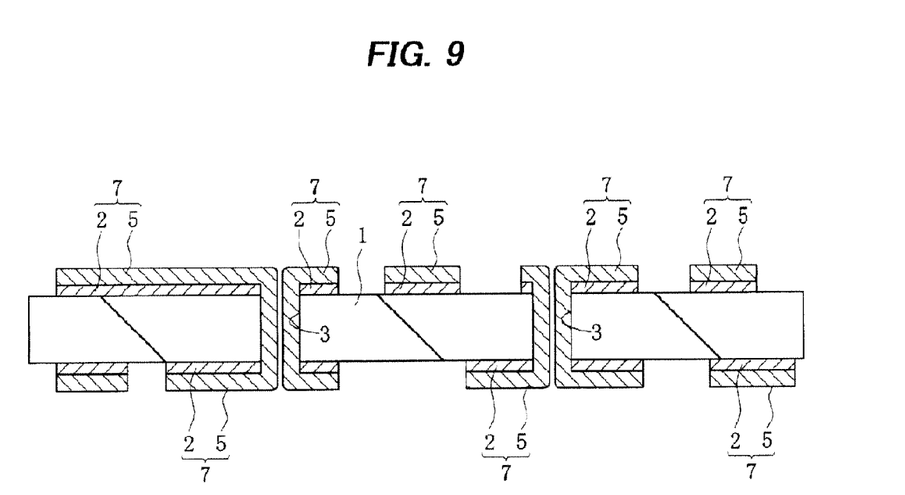
FIG. 9 is a principle part cross-sectional view of the semiconductor device in the manufacturing process of the semiconductor device following FIG. 8.

Next, as shown in FIG. 6, a resist film 6 is coated over each of the copper films 5 formed over the front and rear surfaces of the glass epoxy substrate 1 (process P4 in FIG. 1). Subsequently, as shown in FIG. 7, the resist film 6 is subjected to an exposure treatment and development treatment to pattern the resist film 6 (process P5 in FIG. 1). Subsequently, as shown in FIG. 8, the patterned resist film 6 is used as a mask to etch the copper film 5 and the copper foil 2, thereby removing the copper film 5 and the copper foil 2 having been not covered by the resist film 6 (process P6 in FIG. 1). This forms a wiring layer 7 that contains the copper film 5 and the copper foil 2, and constitutes a circuit pattern, over each of the front and rear surfaces of the glass epoxy substrate 1. After that, as shown in FIG. 9, the resist film 6 is removed (process P7 in FIG. 1).

Figure 10:
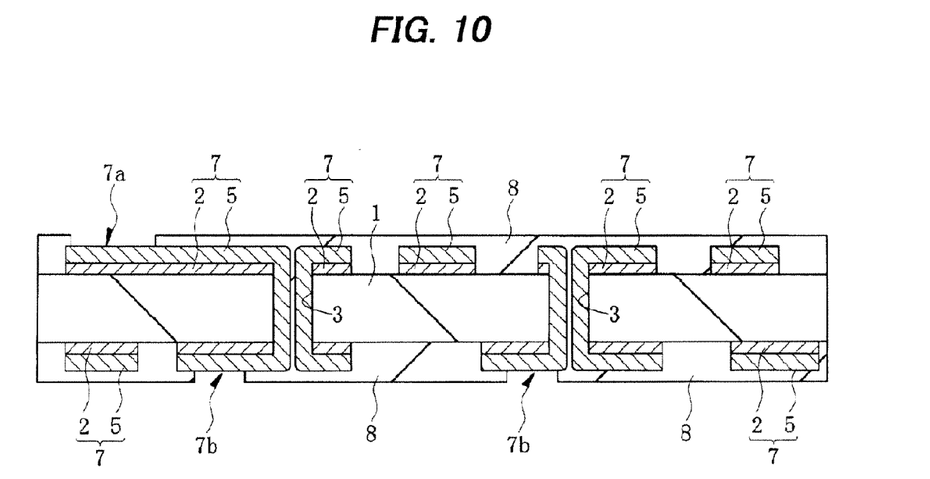
FIG. 10 is a principle part cross-sectional view of the semiconductor device in the manufacturing process of the semiconductor device following FIG. 9.

Next, as shown in FIG. 10, a solder resist 8 is formed so as to cover the wiring layer 7 formed over each of the front and rear surfaces of the glass epoxy substrate 1 (process P8 in FIG. 1). The solder resist 8 is, for example, an insulating film that has an insulating resin containing an organic solvent as a main component and can endure the temperature (for example, around 220 to 260° C.) applied to the wiring substrate when parts are soldered to a completed wiring substrate by using lead-free solder. By forming the solder resist 8, it is possible to prevent the adherence of the solder to unnecessary portions when parts are soldered to the completed wiring substrate, and to protect the wiring layer 7 from external environment such as dust, heat or humidity. Furthermore, the solder resist 8 has a function of protecting the circuit pattern containing the wiring layer 7 to maintain the insulating property of the circuit pattern.

Examples of organic solvents contained in the solder resist 8 include diethylene glycol monoethyl ether acetate (boiling point 217° C.), dipropylene glycol monomethyl ether (boiling point 190° C.), 3-methoxy-3-methylbutyl acetate (boiling point 188° C.) etc., all of which have a high boiling point of 150° C. or more.

For the solder resist 8, a pattern is formed. For example, a pattern of the solder resist 8 can be formed on the front surface side of the glass epoxy substrate 1 by coating the solder resist 8 over the entire front surface of the glass epoxy substrate 1 and, after that, providing an exposure treatment and a development treatment for the solder resist 8. In the same way, a pattern of the solder resist 8 can be formed on the rear surface side of the glass epoxy substrate 1 by coating the solder resist 8 over the entire rear surface side of the glass epoxy substrate 1 and, after that, providing an exposure treatment and a development treatment for the solder resist 8. From the opening of the solder resist 8, plural bonding leads (electrode pads) 7a containing a part of the wiring layer 7 formed over the front surface of the glass epoxy substrate 1 are exposed, and, from the opening of the solder resist 8, plural bump lands (electrode pads) 7b containing a part of the wiring layer 7 formed over the rear surface of the glass epoxy substrate 1 are exposed.

Next, in order to gasify the organic solvent contained in the glass epoxy substrate 1 and the solder resist 8 and to discharge the gasified organic solvent from the inside to the outside of the glass epoxy substrate 1 and the solder resist 8, the glass epoxy substrate 1 covered by the solder resist 8 is subjected to a heat treatment (second heat treatment) in an inert gas atmosphere (process P9 in FIG. 1). The heat treatment is performed at a temperature equal to or higher than the boiling point of the organic solvent contained in the glass epoxy substrate 1 and the solder resist 8. The temperature of the heat treatment, for example, from 160° C. to 230° C. is considered to be a suitable range (needless to say, the temperature is not restricted to this range depending on another condition), and the vicinity range of the temperature with the central value of 200° C. is considered to be most suitable. The time of the heat treatment is, for example, preferably one hour or less. One example of the heat treatment condition includes 200° C. for 30 minutes in a nitrogen atmosphere.

According to the examination of the present inventors, for example, when the remains of gas contained in a photopolymerization initiator after performing the heat treatment at 150° C. is defined as 100%, the remains of gas contained in the photopolymerization initiator after performing the heat treatment at 170° C. was 45%, and the remains of gas contained in the photopolymerization initiator after performing the heat treatment at 200° C. was 12%. Accordingly, by performing a heat treatment at 200° C. for 30 minutes in a nitrogen atmosphere, which is one example of the heat treatment (second heat treatment) according to the invention of the present application, the remaining amount of gas can be reduced by the amount of 80% or more as compared with the case where only the heat treatment on the high temperature side (150° C.) in the heat treatment of usual dehumidification is provided.

Figure 11:
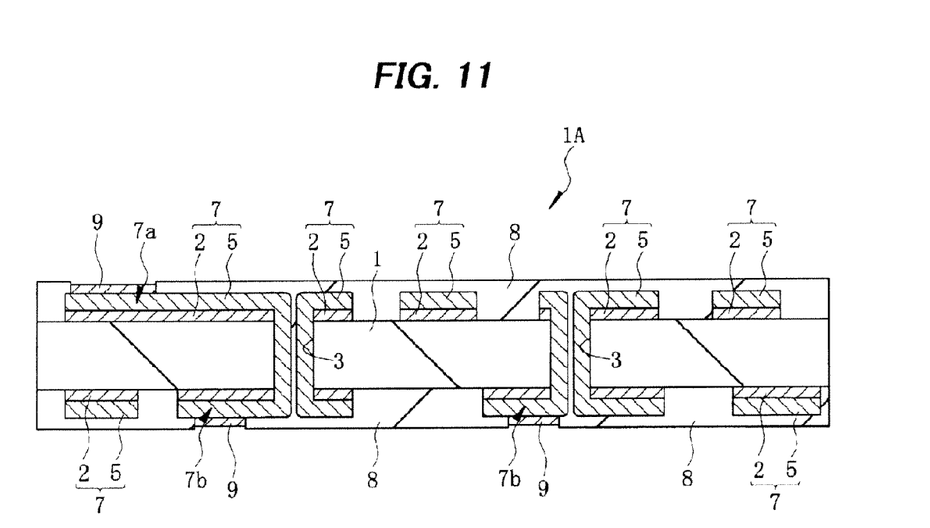
FIG. 11 is a principle part cross-sectional view of the semiconductor device in the manufacturing process of a semiconductor device following FIG. 10.

Next, as shown in FIG. 11, the front surface and rear surface sides of the glass epoxy substrate 1 are washed, and, after that, a plated film 9 is formed over the surface of the plural bonding leads 7a and the surface of the plural bump lands 7b exposed from the opening of the solder resist 8 (process P10 in FIG. 1). The plated film 9 contains, for example, a gold film or a laminated film of nickel and gold. After that, the appearance check is performed (process P11 in FIG. 1).

Next, for the dehumidification, the glass epoxy substrate 1 covered with the solder resist 8 is subjected to a heat treatment (first heat treatment) in air (process P12 in FIG. 1). The heat treatment is performed at a temperature of the boiling point of water or more. The temperature of the heat treatment from 120° C. to 150° C. is considered to be a suitable range (needless to say, the temperature is not restricted to this range depending on another condition). The time of the heat treatment is, for example, preferably from 3 hours to 5 hours. One example of the heat treatment condition includes 125° C. for 4 hours in air can be mentioned.

The manufacturing process explained above completes the wiring substrate 1A.

Next, the manufacturing process of a semiconductor device, in which a semiconductor chip is mounted over the upper surface of the wiring substrate 1A, will be explained using FIGS. 12 to 19. In FIGS. 12 to 17, only a region in which one semiconductor chip is mounted is shown.

Figure 12:
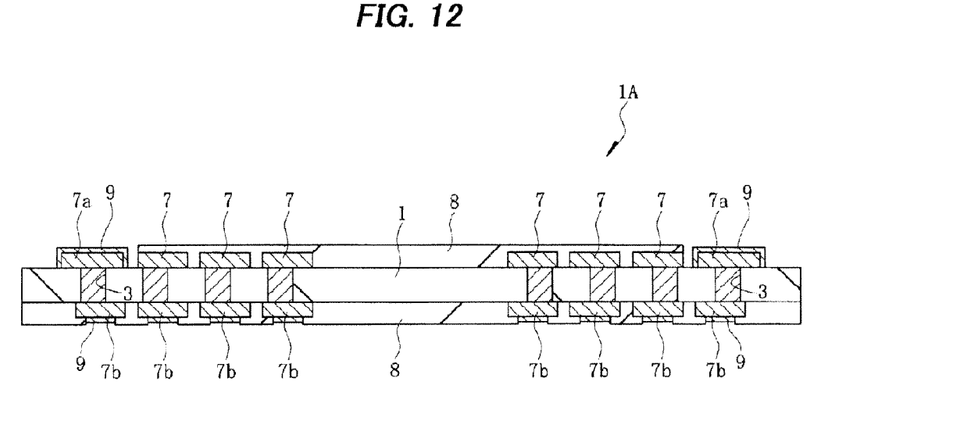
FIG. 12 is a principle part cross-sectional view of the semiconductor device in the manufacturing process of the semiconductor device following FIG. 11.

First, as shown in FIG. 12, the wiring substrate 1A formed by the aforementioned manufacturing process is prepared. The wiring substrate 1A is a multipiece substrate, for example, having regions (chip-mounting region, unit frame) zoned and formed in a matrix shape in which one semiconductor chip is mounted.

Figure 13:
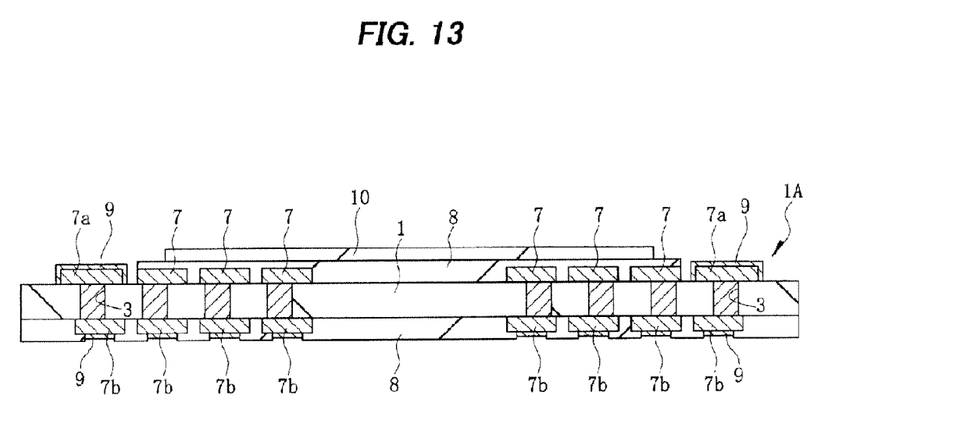
FIG. 13 is a principle part cross-sectional view of the semiconductor device in the manufacturing process of the semiconductor device following FIG. 12.

Next, as shown in FIG. 13, an adhesion layer (die bond material) 10 is placed over the solder resist 8 on the upper surface (first surface, front surface) side of the wiring substrate 1A. Subsequently, for example, a heat treatment at 160° C. to 240° C. is provided to stick the adhesion layer 10 over the solder resist 8 on the upper surface side of the wiring substrate 1A. The adhesion layer 10 functions as an adhesive agent in a film shape, which has such advantages that the reliability on the insulation properties is high, no gas bubble occurs, and no inclination occurs in a semiconductor chip because of a uniform thickness.

Figure 14:
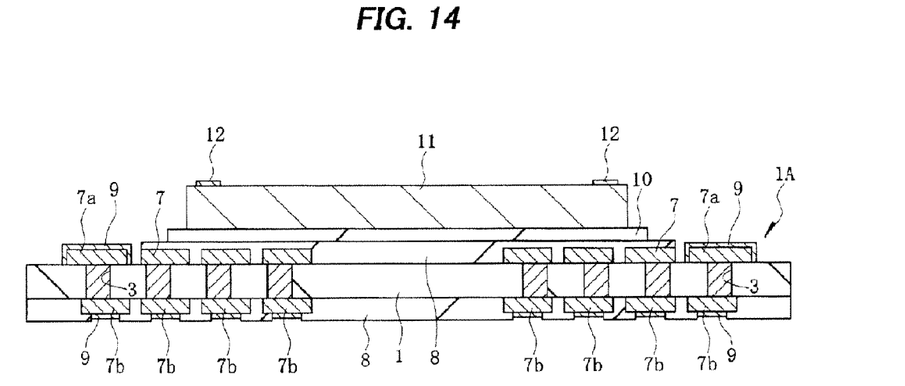
FIG. 14 is a principle part cross-sectional view of the semiconductor device in the manufacturing process of the semiconductor device following FIG. 13.

Next, as shown in FIG. 14, the semiconductor chip 11 is placed over the solder resist 8 on the upper surface side of the wiring substrate 1A via the adhesion layer 10. Subsequently, for example, a heat treatment at 200° C. to 240° C. is provided to stick the semiconductor chip 11 over the solder resist 8 on the upper surface side of the wiring substrate 1A via the adhesion layer 10 (process S1 in FIG. 1).

The semiconductor chip 11 mainly has a configuration that includes a semiconductor substrate containing silicon, plural semiconductor elements (internal circuit including a core power supply circuit, input/output circuit) formed over the main surface of the semiconductor substrate, a multi-layered wiring layer formed by stacking plural insulating layers and plural wiring layers over the main surface of the semiconductor substrate, and a surface-protecting film formed so as to cover the multi-layered wiring layer, although it is not restricted to this. The insulating layer contains, for example, a silicon oxide film. The wiring layer contains, for example, a film of metal such as aluminum, tungsten or copper. The surface-protecting film contains, for example, a multi-layered film formed by stacking an inorganic insulating film such as a silicon oxide film or a silicon nitride film, and an organic insulating film.

Over the surface of the semiconductor chip 11, plural electrode pads 12 coupled electrically to the semiconductor element are arranged along each side of the semiconductor chip 11. FIG. 14 shows a part of plural electrode pads 12. These electrode pads 12 are composed of the uppermost wiring layer among the multi-layered wiring layer of the semiconductor chip 11, and are exposed from the opening formed in response to each electrode pad 12 in the surface-protecting film of the semiconductor chip 11.

Here, in the process of sticking the adhesion layer 10 over the solder resist 8 on the upper surface side of the wiring substrate 1A, the heat treatment at 160° C. to 240° C. is provided as described above, and, in the process of sticking the semiconductor chip 11 over the solder resist 8 of the upper surface of the wiring substrate 1A via the adhesion layer 10, the heat treatment at 200° C. to 240° C. is provided as described above. On this occasion, however, for example, a heat treatment at a temperature at 160° C. to 230° C. has been provided after forming the solder resist 8 on the front surface and rear surface sides of the glass epoxy substrate 1, respectively, to gasify the organic solvent contained in the material constituting the wiring substrate 1A and to discharge the gasified organic solvent from the inside to the outside of the wiring substrate 1A. Accordingly, in the above-described heat treatment for sticking the adhesion layer 10 and the semiconductor chip 11, no discharge of the gasified organic solvent from the inside of the wiring substrate 1A occurs and, therefore, no gas bubble is trapped and left inside the adhesion layer 10.

Moreover, since no gasified organic solvent adheres to the surface of the semiconductor chip 11, the surface of the plated film 9 covering the plural bonding leads 7a formed over the upper surface of the wiring substrate 1A, and the surface of the plated film 9 covering the plural bump lands 7b formed over the lower surface of the wiring substrate 1A, these surfaces are not contaminated by the gasified organic solvent. Moreover, since a die bonding apparatus is not contaminated by the gasified organic solvent, for example, the cleaning frequency of the apparatus by plasma cleaning can be reduced to improve the productivity.

Figure 15:
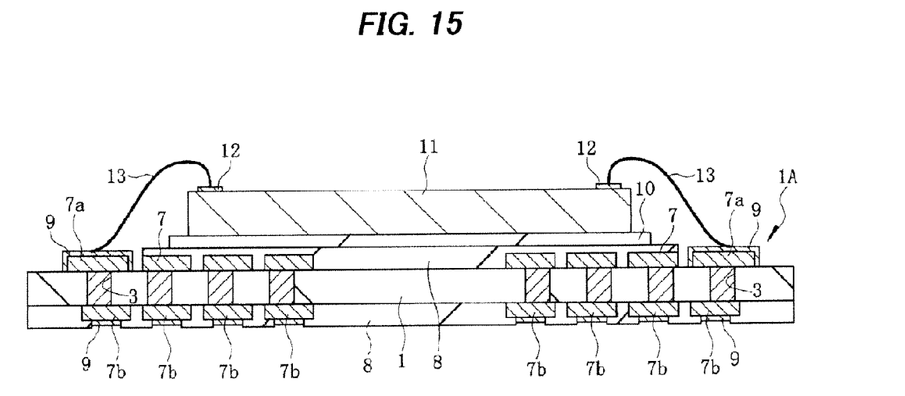
FIG. 15 is a principle part cross-sectional view of the semiconductor device in the manufacturing process of the semiconductor device following FIG. 14.

Next, as shown in FIG. 15, The electrode pad 12 arranged to the margin of the surface of the semiconductor chip 11 is coupled electrically to the bonding lead 7a that is exposed on the upper surface side of the wiring substrate 1A and covered by the plated film through the use of, for example, an electroconductive member 13 by a nail head bonding (ball bonding) method in which thermocompression combined with ultrasonic vibration is used (process S2 in FIG. 1). In FIG. 15, apart among plural electroconductive members 13 is shown. As the electroconductive member 13, for example, a gold wire is used.

As described above, there occurs no such a case where the organic solvent contained in the material constituting the wiring substrate 1A is gasified and the gasified organic solvent adheres to the surface of the plated film 9 covering the plural bonding leads 7a formed over the upper surface of the wiring substrate 1A to contaminate the surface, and, therefore, the coupling strength between the plated film 9 covering the bonding lead 7a and the electroconductive member 13 is not lowered. Moreover, since a wire bonding apparatus is not contaminated by the gasified organic solvent, for example, the cleaning frequency of the apparatus by plasma cleaning can be reduced to improve the productivity.

Figure 16:
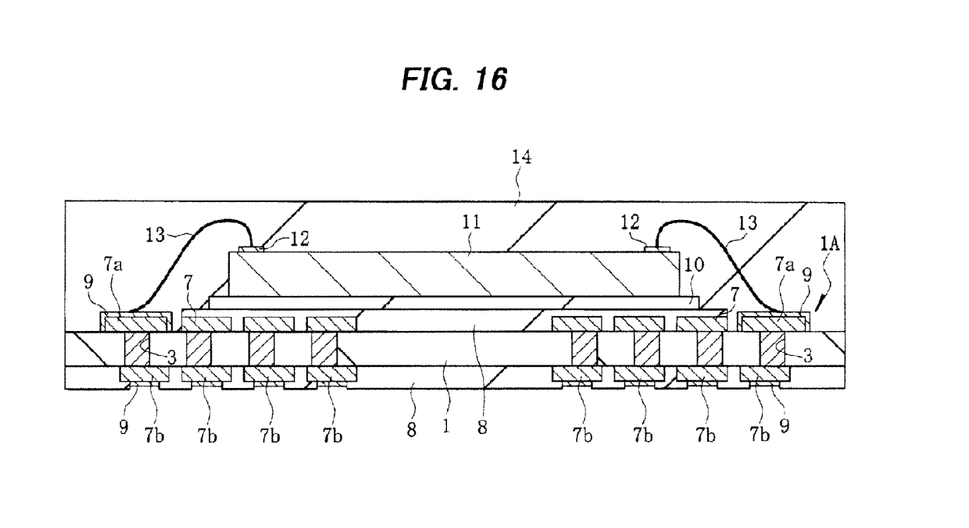
FIG. 16 is a principle part cross-sectional view of the semiconductor device in the manufacturing process of a semiconductor device following FIG. 15.

Next, as shown in FIG. 16, the wiring substrate 1A mounted with plural semiconductor chips 11 is set in a die casting machine, into which a sealing resin liquidized by elevating temperature is inpoured with pressure to seal the upper surface side of the wiring substrate 1A with the sealing resin, thereby mold-forming one resin sealing body (sealing body) 14 (process S3 in FIG. 1). Subsequently, a heat treatment is provided at a temperature of, for example, 170° C. This seals the semiconductor chip 11, electroconductive member 13, adhesion layer 10 etc. with the resin sealing body covering the upper surface side of the wiring substrate 1A. The resin sealing body 14 is formed from, for example, an epoxy-based heat-curable insulating resin to which a phenol-based curing agent, silicone rubber, a lot of fillers (for example, silica) etc. are added, for achieving low stress.

As described above, there occurs no such a case where the organic solvent contained in the material constituting the wiring substrate 1A is gasified and the gasified organic solvent adheres to the surface of the semiconductor chip 11 formed over the upper surface of the wiring substrate 1A to contaminate the surface, and, therefore, the coupling strength between the semiconductor chip 11 and the resin sealing body 14 is not lowered.

After that, a product name, a trace code etc. are marked for each of the chip-mounting regions over the surface of the resin sealing body 14 by, for example, a laser. By performing the marking prior to divide the resin-sealed bodies 14 into pieces, the throughput of the marking process may be improved.

Figure 17:
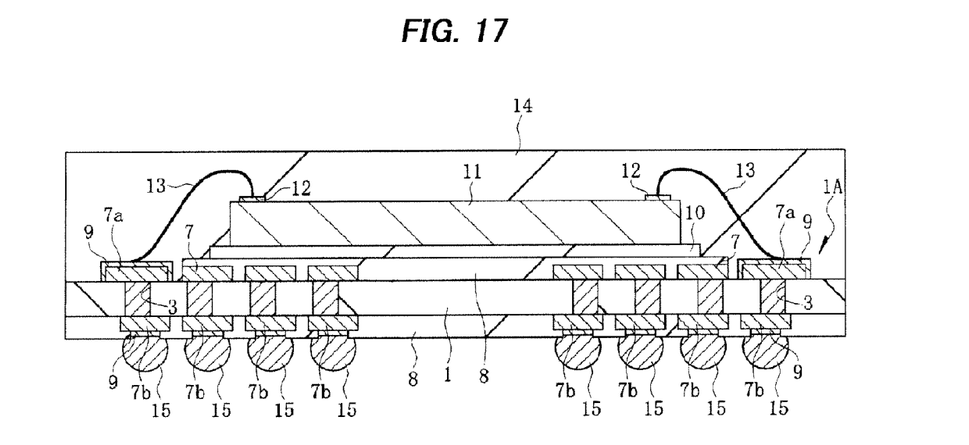
FIG. 17 is a principle part cross-sectional view of the semiconductor device in the manufacturing process of the semiconductor device following FIG. 16.

Next, as shown in FIG. 17, a solder paste is formed over the surface of the plated film 9 that is exposed on the lower surface (second surface, rear surface) side of the wiring substrate 1A and covers the plural bump lands 7b, for example, by a printing method. Subsequently, after arranging a solder ball 15 to each surface of the plural bump lands 7b exposed on the lower surface side of the wiring substrate 1A via the plated film 9 and the solder paste, a heat treatment is provided (process S4 in FIG. 1). As the solder ball 15, a solder bump of a lead free solder composition containing substantially no lead, for example, a solder bump having a composition of Sn-3-[wt%]Ag-0.5-[wt%]Cu is used. The temperature of the heat treatment is, for example, from 220° C. to 260° C. The heat treatment melts and unifies the solder ball 15, the solder paste and the plated film 9, to form the solder ball 15 that is coupled electrically and mechanically with the surface of the bump land 7b. The solder ball 15 works as a conduction channel for inputting/outputting electric signals between the semiconductor device and the mounting substrate.

As described above, there occurs no such a case where the organic solvent contained in the material constituting the wiring substrate 1A is gasified and the gasified organic solvent adheres to the surface of the plated film 9 covering the plural bump lands 7b formed over the lower surface of the wiring substrate 1A to contaminate the surface, and, therefore, the connection strength between the bump land 7b and the solder ball 15 is not lowered.

Next, as shown in FIG. 18, a dicing blade 16 is traveled along a dicing line 17 in a first direction and a second direction orthogonally crossing the first direction to cut the wiring substrate 1A and the resin sealing body 14 (process S5 in FIG. 1). As shown in FIG. 19, this divides the substrate into individual semiconductor device 20 to form plural semiconductor devices 20 (process S6 in FIG. 1).

After that, divided pieces of the semiconductor device 20 are screened based on the product specification and are subjected to the final appearance check to complete the product.

As described above, according to the present embodiment, the organic solvent contained in materials constituting the wiring substrate 1A is gasified and the gasified organic solvent is discharged from the inside to the outside of the wiring substrate 1A, by providing the heat treatment at 160° C. to 230° C. in an inert gas atmosphere for the glass epoxy substrate 1 covered by the solder resist 8 after the process of forming the solder resist 8 for protecting each of wiring layers 7 on the front surface and rear surface sides of the glass epoxy substrate 1, and before the process of forming the plated film 9 over the surface of the plural bonding leads 7a containing a part of the wiring layer 7 and the surface of the plural bump lands 7b.

This can give following effects. (1) When the semiconductor chip 11 is stuck over the solder resist 8 via the adhesion layer 10, no such case occurs where an organic solvent contained in the material constituting the wiring substrate 1A is gasified and the gasified organic solvent is trapped and left inside the adhesion layer 10 as a gas bubble. Therefore, moisture does not accumulate inside the adhesion layer 10. Accordingly, when heat around 260° C. is applied in the subsequent process, for example, in the process of mounting the semiconductor device over the mounting substrate by using solder, there is no risk of phreatic eruption etc. (2) The surface of the semiconductor chip 11 is not contaminated by a gasified organic solvent. Therefore, the lowering of the coupling strength between the electroconductive member 13 and the electrode pad 12 arranged over the surface of the semiconductor chip 11 can be prevented. (3) The surface of the semiconductor chip 11 is not contaminated by a gasified organic solvent. Therefore, the lowering of the close-contact properties of the semiconductor chip 11 and resin sealing body 14 can be prevented. (4) For example, a die bonding apparatus and a wire bonding apparatus are not contaminated by a gasified organic solvent. Therefore, the cleaning frequency thereof by, for example, plasma cleaning becomes low to improve the productivity. (5) The heat treatment for dehumidification and the heat treatment for discharging gas caused by the organic solvent are performed separately. Therefore, the heat treatment time and temperature can be set arbitrarily to reduce the damage resulting from the thermal history left to the wiring substrate. That is, in the heat treatment for the dehumidification, a longer time and a lower temperature are selected because water is hard to evaporate as compared with the gas component caused by the organic solvent. On the other hand, in the heat treatment for discharging the gas caused by the organic solvent, a shorter time and a higher temperature are selected, because the gas component evaporates more easily but has a higher boiling point than water.

In the above, the invention accomplished by the present inventors has been specifically explained based on the embodiments. However, needless to say, the present invention is not restricted to the embodiments, and various changes can be made without departing the scope of the invention.

The present invention can be applied to the manufacturing method of a semiconductor device in which an electronic part is mounted on a wiring substrate protected by an insulating film having an insulating resin containing an organic solvent as the main component.

What is claimed is:

1. A manufacturing method of a semiconductor device comprising the steps of:
    (a) providing a wiring substrate having a base material of resin, a wiring layer formed over each of a front surface and a rear surface of the base material and a solder resist film covering the wiring layer while exposing a part of the wiring layer;
    (b) after the step (a), mounting a semiconductor chip over the solder resist film of the wiring substrate via an adhesive layer;
    (c) after the step (b), coupling electrically plural electrode pads arranged over the surface of the semiconductor chip with plural bonding leads that contains the part of the wiring layer and is exposed from an opening formed in the solder resist film by an electrical conductive member; and
    (d) after the step (c), forming a resin sealing body on the wiring substrate to cover the semiconductor chip, the electrical conductive member, and the adhesive layer,
    wherein the wiring substrate in the step (a) has previously been subjected to the steps of:
    (a1) performing a first heat treatment at a first temperature and a first treatment time; and
    (a2) performing a second heat treatment at a second temperature and a second treatment time;
    wherein the second temperature is higher than the first temperature; and
    wherein the second treatment time is shorter than the first treatment time.

2. The manufacturing method of a semiconductor device according to claim 1,
    wherein the first temperature of the first heat treatment is from 100° C. to 150° C., and
    wherein the second temperature of the second heat treatment is from 160° C. to 230° C.

3. The manufacturing method of a semiconductor device according to claim 2,
    wherein the first treatment time of the first heat treatment is from 3 hours to 5 hours, and the second treatment time of the second heat treatment is 1 hour or less.

4. The manufacturing method of a semiconductor device according to claim 1,
    wherein the second heat treatment is performed prior to the first heat treatment.

5. The manufacturing method of a semiconductor device according to claim 1, wherein the first heat treatment is performed mainly to remove moisture existing inside the wiring substrate, while the second heat treatment is performed mainly to remove organic gas due to organic solvent contained in the wiring substrate.

* * * * *

UNITED STATES PATENT AND TRADEMARK OFFICE
CERTIFICATE OF CORRECTION

| | | |
|---|---|---|
| PATENT NO. | : 8,629,002 B2 | Page 1 of 1 |
| APPLICATION NO. | : 13/662204 | |
| DATED | : January 14, 2014 | |
| INVENTOR(S) | : Soshi Kuroda et al. | |

It is certified that error appears in the above-identified patent and that said Letters Patent is hereby corrected as shown below:

On the Title page Item (30) Foreign Application Priority Data should read,

Feb. 15, 2010    (JP)            2010-030336

Signed and Sealed this
Thirtieth Day of December, 2014

Michelle K. Lee
*Deputy Director of the United States Patent and Trademark Office*